United States Patent
Ballamine et al.

(10) Patent No.: US 6,218,315 B1
(45) Date of Patent: Apr. 17, 2001

(54) HTO (HIGH TEMPERATURE OXIDE) DEPOSITION FOR CAPACITOR DIELECTRICS

(75) Inventors: Arne Watson Ballamine, Gold Spring; Kevin K. Chan, Staten Island, both of NY (US); Douglas Duane Coolbaugh, Essex Junction; Donna Kaye Johnson, Underhill, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/512,721

(22) Filed: Feb. 24, 2000

(51) Int. Cl.[7] .................................................. H01L 21/31
(52) U.S. Cl. ........................... 438/778; 438/787; 438/680
(58) Field of Search .................................. 438/778, 787, 438/680, 585

(56) References Cited

U.S. PATENT DOCUMENTS

| | | | |
|---|---|---|---|
| 5,478,765 | 12/1995 | Kwong et al. | |
| 5,714,411 | 2/1998 | Trahan et al. | |
| 5,869,394 | * 2/1999 | Chen et al. | 438/624 |
| 5,872,057 | * 2/1999 | Lee | 438/655 |
| 5,879,981 | 3/1999 | Tanigawa | |
| 5,885,869 | * 3/1999 | Turner et al. | 438/261 |
| 5,914,851 | 6/1999 | Saenger et al. | |
| 5,960,289 | * 9/1999 | Tsui et al. | 438/275 |
| 6,063,300 | * 5/2000 | Suzuki et al. | 216/59 |

* cited by examiner

Primary Examiner—Matthew Smith
Assistant Examiner—Renzo N. Rocchegiani
(74) Attorney, Agent, or Firm—Scully, Scott, Murphy & Presser; William D. Sabo, Esq.

(57) ABSTRACT

Reliable HTO (High Temperature Oxide) dielectrics are provide by a rapid thermal chemical vapor deposition (RTCVD) process in which a low pressure and a high ratio of reactants, e.g., oxygen-containing gas to silane-containing gas, is employed. Specifically, the reliable HTO is formed by a rapid thermal chemical vapor deposition at temperatures of from about 500° C. or above, said rapid thermal chemical vapor deposition process being carried out at a pressure of less than 80 Torr and in the presence of at least one oxygen-containing reactant and at least one silane-containing reactant, said reactants having a ratio of oxygen-containing to silane-containing of about 25:1 or greater. Semiconductor devices such as capacitors and transistors that include at least a layer of the high temperature oxide of the present invention used as a dielectric material are also provided.

20 Claims, 1 Drawing Sheet

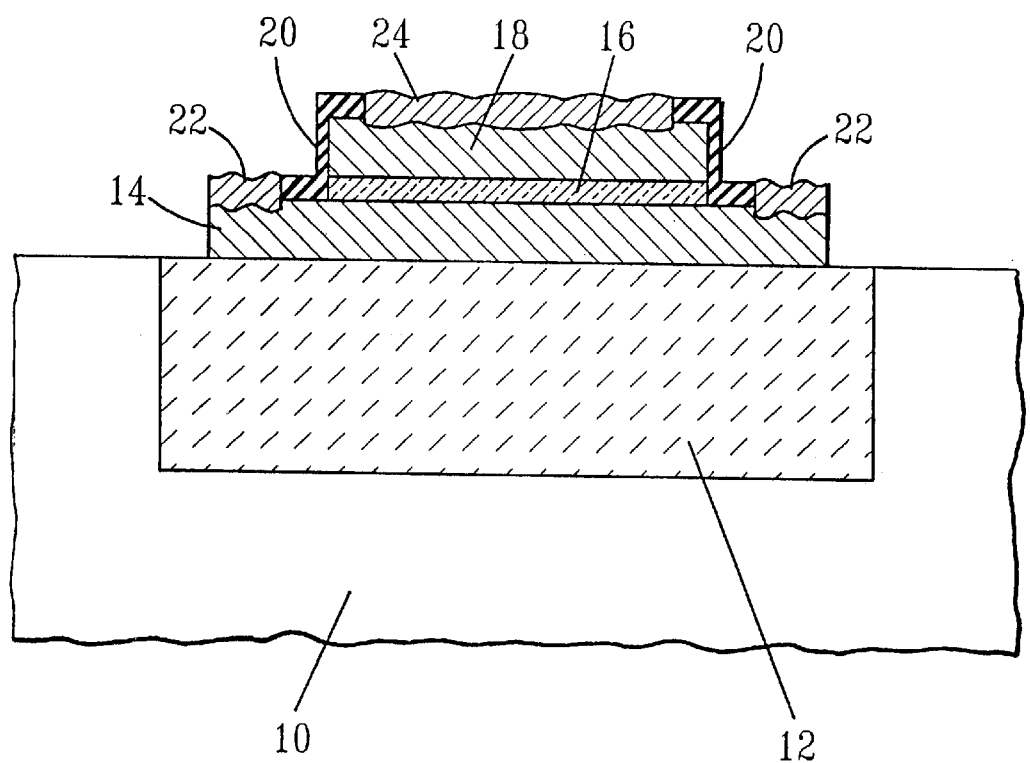

HTO (HIGH TEMPERATURE OXIDE) DEPOSITION FOR CAPACITOR DIELECTRICS

DESCRIPTION

1. Field of the Invention

The present invention is directed to a method for forming a reliable high temperature oxide (HTO) which is useful as a dielectric material in various semiconductor devices such as capacitors, transistors and other like devices which require at least one dielectric material therein. The present invention also relates to various semiconductor devices such as capacitors and transistors which include at least the high temperature oxide of the present invention as a dielectric material.

2. Background of the Invention

Dielectric materials in high density circuits appear as capacitors in dynamic random access memory (DRAM) applications, gate dielectrics in transistors and as decoupling capacitors. The dielectric material in these structures is typically silicon dioxide ($SiO_2$) which is formed by ozone deposition of tetraethylorthosilicate (TEOS).

Several problems however exist with dielectrics that are formed by ozone TEOS deposition. For instance, dielectrics that are formed from ozone TEOS are typically thick (200 Å or more) and it is difficult to control the uniformity and repeatability of the thickness using such a deposition process. Thus, alternative methods of forming dielectrics that are thin, yet have a good uniformity control are continuously being sought.

One solution to the above problem is to use high temperature oxides (HTOs) which are deposited using low pressure chemical vapor deposition (LPCVD) at temperatures of 500° C. or higher. Under such conditions, and if deposited directly on silicon, interfacial layers form which may degrade device performance. In addition, grain boundary leakage paths and lowered barrier heights may result which could lead to high device leakage. Thus, HTOs formed from prior art LPCVD processes are not reliable enough for use in the current generation of semiconductor devices, nor will they be reliable in future generations either.

In addition, processing with LPCVD batch furnace systems historically produces poor HTO deposition results. Only when substrates are loaded into a holding structure— designed to extend the wafer edge boundary condition— and then placed in the LPCVD furnace are uniformities improved. Use of such a jig, however, does not present a manufacturable process because loading the wafers in such a manner is extremely time consuming and risks wafer damage and contamination.

Moreover, prior art processes of fabricating HTOs produce oxides that are not sufficiently dense and/or the oxides contain impurities such as hydrogen therein. These properties also lead to a HTO dielectric that is not reliable. Additionally, prior art processes typically produce oxides that are not stoichiometric, i.e., the quantitative relationship between Si and oxide is significantly less than two oxygens to one silicon.

In view of the drawbacks with prior art dielectric materials, it would be beneficial if a new method was developed which produces a HTO dielectric that is reliable, yet thin enough to be employed in today's generation of devices. Such a method should also be capable of producing HTOs that are substantially stoichiometric.

SUMMARY OF THE INVENTION

One object of the present invention is to provide a method of forming a high temperature oxide (HTO) in which the method provides improved thickness uniformity control.

Another object of the present invention is to provide a method of forming a thin HTO dielectric whose thickness is below 50 Å, preferably below 20 Å.

A yet further object of the present invention is to provide a method of forming a HTO dielectric that has improved reliability, lower etch rates, yet is formed using a lower thermal budget than conventional oxides.

These and other objects and advantages are achieved in the present invention by forming a HTO dielectric by a rapid thermal chemical vapor deposition (RTCVD) process in which a low pressure and a high ratio of reactants, e.g., oxygen-containing gas and silane-containing gas, is employed.

Specifically, the method of the present invention comprises forming a high temperature oxide on the surface of a substrate, wherein said high temperature oxide is formed by a rapid thermal chemical vapor deposition process at temperatures of from about 500° C. or above, said rapid thermal chemical vapor deposition process being carried out at a pressure of less than 80 Torr and in the presence of at least one oxygen-containing reactant and at least one silane-containing reactant, said reactants having a ratio of oxygen-containing to silane-containing of about 25:1 or greater.

The term "substrate" is employed herein to denote any material layer in which a dielectric material is required to isolate the same from an overlaying material layer. Thus, the term "substrate" is used herein to denote semiconductor substrates such as Si, Ge, SiGe, GaAs, InP InAs and other III/V semiconductor compounds, layered semiconductor substrates, i.e., Si/SiGe, silicon-on-insulators (SIOs), interconnect structures containing wiring layers, conductive materials such as electrodes and other like material layers which require isolation. A preferred substrate employed in the present invention is an electrode that is composed of a conductive material such as Cu, W, Pt, Pd, Ta, Au, Ag, Cr and other like metals, alloys or silicates of said metals, doped single-crystal silicon, doped polysilicon and other like conductive materials.

Another aspect of the present invention relates to semiconductor structures such as capacitors and transistors that include at least a layer of the high temperature oxide of the present invention used as a dielectric material. In the case of a capacitor, the HTO dielectric of the present invention is formed on the surface of a bottom electrode, e.g., polysilicon. A top electrode, e.g., polysilicon, can be formed over the HTO dielectric.

BRIEF DESCRIPTION OF THE DRAWINGS

FIG. 1 is a cross-sectional view of a capacitor that can be formed using the HTO of the present invention as a dielectric layer separating a bottom electrode from a top electrode of the device.

DETAILED DESCRIPTION OF THE INVENTION

As stated above, the present invention relates to a method of forming a highly reliable high temperature oxide (HTO) that can be employed as a dielectric material in various semiconductor devices such as, but not limited to: capacitors, transistors, interconnect structures and other like devices wherein at least one dielectric material is required. A preferred use for the HTO of the present invention is as a capacitor dielectric.

A typical capacitor in which the HTO dielectric of the present invention can be employed is shown in FIG. 1. It is noted that although the specific details herein are related to capacitor devices, the HTO dielectric can be used in other semiconductor devices in which at least one dielectric material is required. Thus, the present invention should not be limited to the capacitor embodiment shown in FIG. 1 and described hereinebelow.

Specifically, FIG. 1 is a cross-sectional view of a capacitor device which includes the HTO dielectric of the present invention therein. The capacitor shown in FIG. 1 comprises a semiconductor substrate 10 having a shallow trench isolation region 12 formed therein. The capacitor further includes a patterned bottom electrode 14, a high temperature oxide 16 (formed in accordance with the present invention), a patterned top electrode 18, nitride spacers 20, and silicide regions 22 and 24 formed in the bottom and top electrodes, respectively.

In such a device, the bottom and top electrodes may be composed of the same or different conductive material. For example, the bottom and top electrodes may be composed of the same or different conductive material selected from the group consisting of metals such as W, Cu, Pt, Pd, Au, Ag, Cr, Ta, and other like metals; alloys or silicates of said metals; and doped single-crystal or polycrystalline silicon. In one preferred embodiment of the present invention, both electrodes are composed of doped polysilicon. When both electrodes are composed of doped polysilicon, a poly/poly capacitor is formed. When one of the electrodes is composed of a conductive metal and one of the electrodes is composed of doped polysilicon, a poly/metal capacitor is formed. A metal/metal capacitor is also possible, if the two electrodes are composed of conductive metals, alloys or silicates. The present invention contemplates all types of capacitors including, but not limited to: stacked capacitors, trench capacitors, decoupling capacitors and other like capacitors.

The stacked capacitor structure shown in FIG. 1 is prepared utilizing conventional processing steps well known to those skilled in the art except for the deposition of the high temperature oxide (HTO) which is formed utilizing the rapid thermal chemical vapor deposition (RTCVD) process described hereinbelow. Since all of the other processing steps are known to those skilled in the art, a detailed description of the same is not given herein, nor is a description needed to practice the present invention.

For example, it is well known to those skilled in the art to form shallow trench isolation region 12 in substrate 10 by lithography and etching and then filling the etched trench with a trench dielectric material such as TEOS utilizing a conventional deposition process such as chemical vapor deposition (CVD) or plasma-assisted CVD. In some cases, a barrier layer may be formed in the etched trench prior to trench dielectric fill. Bottom electrode 14 is then formed by a conventional deposition process such as chemical vapor deposition, plasma-assisted CVD, sputtering, evaporation or another like deposition process. When polysilicon is employed as the bottom electrode material, doping of the polysilicon may be conducted in-situ or after deposition and patterning using conventional ion implantation and activation annealing.

Following deposition of the bottom electrode and optional doping, the electrode may be patterned utilizing a conventional patterning process, e.g., lithography and etching (reactive-ion etching). Next, HTO dielectric 16 is formed utilizing the processing conditions to be mentioned hereinbelow. After the HTO has been deposited, top electrode 18 is formed in the same manner as described hereinabove for the bottom electrode and thereafter it is patterned. Next, nitride spacers 20 are formed utilizing a conventional deposition process such as chemical vapor deposition and the exposed regions of the top and bottom electrodes are subjected to a conventional salicide process.

An alternative capacitor device to the one illustrated in FIG. 1 would include a stack of ozone TEOS and the HTO of the present invention as the dielectric material, said stack being sandwiched between bottom and top electrodes.

It is again emphasized that the various processing steps used in fabricating the capacitor of FIG. 1 are well known except for the method used in forming HTO 16. In embodiments wherein the HTO dielectric of the present invention is used in other semiconductor devices, such as transistors, conventional processing steps are used in forming the specific device, with the exception of the HTO dielectric which is formed utilizing the method of the present invention.

The HTO dielectric of the present invention is formed by utilizing a rapid thermal chemical vapor deposition (RTCVD) process in which a low pressure, high temperature and a high ratio of reactants, e.g., oxygen-containing to silane-containing, is employed.

Specifically, the HTO of the present invention is formed by rapid thermal chemical vapor deposition (RTCVD) at temperatures of from about 500° C. or above for a time period of from about 150 seconds or less. More specifically, the RTCVD is carried out at a temperature of from about 700 to about 800° C. for a time period of from about 120 to about 10 seconds.

The RTCVD process used in forming HTO dielectric 16 is carried out at a pressure of less than 80 Torr, with a pressure of from about 60 to about 75 Torr being more highly preferred. High deposition pressures should be avoided because the same result in a HTO that does not have good conformality. Also pressures above 100 Torr may be precluded by safety interlocks on some systems.

The reactants used in forming HTO dielectric 16 comprise at least one oxygen-containing gas and at least one silane-containing gas. These reactants are highly pure having a purity of at least about 95%, with a purity of about 98% or higher being more preferred. The reactants may be used alone, or they may be used in conjunction with an inert carrier gas such as He, $N_2$, Ar or another like gas.

The ratio of reactants, i.e., oxygen-containing to silane-containing, employed in the RTCVD process of the present invention is at least about 25:1 or greater, with a ratio of oxygen-containing reactant to silane-containing reactant of from about 40:1 to about 50:1 being more highly preferred. It is noted that a high ratio of said reactants must be employed in the present invention otherwise a highly reliable HTO dielectric can not be formed. When the ratio of reactants is low, below 25:1 oxygen-containing to silane-containing, a stoichiometric oxide layer comprising substantially $SiO_2$ is not formed.

The term "silane-containing" is used herein to denote a reactant gas in which silane is present. Illustrative examples of some silane-containing reactants that can be employed in the present invention include, but are not limited to: TEOS, silane ($SiH_4$), dichlorosilane ($SiCl_2H_2$) diisopropyldimethoxysilane (DIPS), tetraethylsilane, tetrakis (trimethylsiyl)silane, tetramethylsilane, triethoxysilane, triisopropylsilane and the like thereof. Mixtures of the above-mentioned silane-containing gases can also employed in the present invention. Of these silane-containing reactants, it is highly preferred to use silane-containing reactants that do not contain Cl since Cl-containing reactants may form an unreliable dielectric. TEOS and $SiH_4$ are examples of preferred silane-containing reactants. It is noted that the silane-containing reactant provides the source of silicon, i.e., Si, for the HTO dielectric.

The term "oxygen-containing" denotes a reactant as in which oxygen is present. Illustrative examples of oxygen-containing gases that can be employed in the present invention include, but are not limited to: oxygen, nitrous oxide, ozone and the like thereof.

Mixtures of the above-mentioned oxygen-containing gases can also be employed in the present invention. Of these oxygen-containing reactants, it is highly preferred to use nitrous oxide, $N_2O$, as the oxygen-containing reactant. It is noted that the oxygen-containing gas provides the oxygen source for the HTO dielectric.

When the above RTCVD process is employed, a highly reliable HTO dielectric is formed. Specifically, when the above mentioned RTCVD process is employed, the following advantages are obtained:

(1) Improved thickness uniformity control.

(2) An ability to deposit a thin oxide film to create a reliable, repeatable HTO dielectric. The RTCVD process of the present invention is capable of forming a HTO dielectric having a thickness of less than 50 Å, and more preferably less than 20 Å.

(3) Improved reliability.

(4) A substantially stoichiometric oxide is formed.

(5) A low etch rate in conventional chemical etchants such as HF is observed; therefore providing higher etch selectivity.

(6) A lower thermal budget.

As stated above, the present invention also relates to various semiconductor devices which include at least the HTO of the present invention as a dielectric material. A preferred device of the present invention is a capacitor device as is shown in FIG. 1. The HTO dielectric, which is formed in such devices utilizing the method described above, is characterized as being: substantially stoichiometric; thin (less than 50 Å); reliable; a continuous, repeatable film having a substantially uniform thickness; and a film having a high oxide density. Moreover, the HTO dielectric prepared utilizing the process of the present invention has a high conformality on the order of 80 to 100%.

One good method for evaluating the density of a deposited oxide film, such as HTO, is to compare the etch rate of the deposited HTO to that of a thermally grown $SiO_2$ film when both films are subjected to an acid etch of HF solution. While ozone TEOS films and other deposited oxides often produce etch rates of more than four to six times that of the thermal oxide, when this test is performed on the film as deposited, the HTO film etch rate will not exceed four to six times that of the thermal oxide.

The following example is given to illustrate the present invention and to demonstrate some advantages that can arise therefrom.

EXAMPLE

In this example, a capacitor device like the one illustrated in FIG. 1 containing a HTO dielectric of the present invention was prepared and a comparative device containing ozone TEOS was also fabricated. The ozone TEOS containing device was prepared in accordance with prior art methods that are well known to those skilled in the art.

A third device containing a stack of TEOS and the HTO oxide of the present invention was also prepared utilizing prior art processes and the process of the present invention.

In regard to the devices containing the HTO dielectric of the present invention, the devices were fabricated utilizing standard capacitor fabrication processing steps with the exception of the HTO dielectric which was prepared in accordance with the RTCVD process of the present invention. Specifically, the HTO dielectric was formed as follows:

Chamber susceptor temperature: 775° C.
Deposition temperature: 775° C.
Pressure: 75 Torr Carrier gas conditions:
Main $N_2$ flow: 8 SLPM (standard liters per minute)
Slit $N_2$ flow: 1.2 SLPM Processing Steps
1. Stabilize oxygen-containing reactant gas for 45 seconds
    Gases: Carrier gas+$N_2O$ at 2.8 SLPM to vent
2. Stabilize silane-containing reactant gas for 30 seconds
    Gases: Carrier gas+$N_2O$ at 2.8 SLPM to wafer +$SiH_4$ at 60 SCCM (standard cubic centimeter per minute) to vent
3. Deposit for 15 seconds in order to obtain a HTO dielectric having a thickness of about 200 Å
    Gases: Carrier gas+$N_2O$ at 2.8 SLPM to wafer +$SiH_4$ at 60 SCCM to wafer
4. Purge silane-containing reactant gas for 12 seconds
    Gases: Carrier gas+$N_2O$ at 2.8 SLPM to wafer
5. Purge oxygen-containing reactant gas for 30 seconds
    Gases: Carrier gas only
    Pump pressure up to transfer pressure chamber The following table provides the parametrics of each device obtained in this example:

| Wafer | Process | $T_{ox}$ (Å) | Vb(+) (V) | Vb(−) (V) | Ef (MV/Cm) | Cap (fF/$\mu m^2$) |
|---|---|---|---|---|---|---|
| 1 | Ozone TEOS | 221 | 23.0 | 23.1 | 10.6 | 1.56 |
| 2 | HTO (INVENTION) | 236 | 23.5 | 23.4 | 9.8 | 1.46 |
| 3 | Stacked | 235 | 23.6 | 24.1 | 10.2 | 1.47 |

In the above table $T_{ox}$ = oxide thickness;
Vb(+) = breakdown voltage using a positive ramp;
V(−) = breakdown voltage using a negative ramp;
Ef = electric field; and
cap = capacitance.

The above parameters were determined using standard procedures well known in the art.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claimed as new and desire to secure by the Letters Patent is:

1. A method of forming a high temperature oxide on the surface of a substrate, said method comprising forming said high temperature oxide on said surface of said substrate by a rapid thermal chemical vapor deposition process at temperatures of from about 500° C. or above, said rapid thermal chemical vapor deposition process being carried out at a pressure of less than 80 Torr and in the presence of at least one oxygen-containing reactant and at least one silane-containing reactant, said reactants having a ratio of oxygen-containing reactant to silane-containing reactant of about 25:1 or greater.

2. The method of claim 1 wherein said substrate is a semiconductor substrate, a layered semiconductor substrate, a silicon-on-insulator, an interconnect structure or a conductive material.

3. The method of claim 1 wherein said substrate is an electrode of a capacitor device.

4. The method of claim 3 wherein said electrode is composed of a conductive material selected from the group consisting of a conductive metal, a conductive metal alloy, a metal silicate, doped single-crystal silicon and doped polysilicon.

5. The method of claim 4 wherein said conductive metal, metal alloy or metal silicate comprises at least one metal selected from the group consisting of W, Cu, Pt, Pd, Au, Ag, Cr and Ta.

6. The method of claim 3 wherein said electrode is doped polysilicon.

7. The method of claim 1 wherein said rapid thermal chemical vapor deposition process is carried out for a time period of 150 seconds or less.

8. The method of claim 1 wherein said rapid thermal chemical vapor deposition process is carried out at a temperature of from about 700° to about 800° C. for a time period of from about 120 to about 10 seconds.

9. The method of claim 1 wherein said rapid thermal chemical vapor deposition process is carried out at a pressure of from about 60 to about 75 Torr.

10. The method of claim 1 wherein said rapid thermal chemical vapor deposition process is carried out in the presence of an inert carrier gas.

11. The method of claim 1 wherein said ratio of oxygen-containing reactant to silane-containing reactant is from about 40:1 to about 50:1.

12. The method of claim 1 wherein said silane-containing reactant is selected from the group consisting of tetraethylorthosilicate (TEOS), diisopropyldimethoxysilane (DIPS), silane, dichlorosilane, tetraethylsilane, tetrakis(trimethylsiyl)silane, tetramethylsilane, triethoxysilane, triisopropylsilane and mixtures thereof.

13. The method of claim 12 wherein said silane-containing reactant is TEOS, silane or any other non-chlorine containing silane.

14. The method of claim 1 wherein said oxygen-containing reactant is selected from the group consisting of oxygen, nitrous oxide, ozone and mixtures thereof.

15. The method of claim 14 wherein said oxygen-containing reactant is nitrous oxide.

16. A high temperature oxide produced by the method of claim 1, said high temperature oxide being a substantially stoichiometric thin film oxide having a thickness below 50 Å.

17. A capacitor comprising at least a high temperature oxide of claim 16 formed on a surface of a first electrode.

18. The capacitor of claim 17 further comprising a semiconductor substrate on which said first electrode is formed thereon and a second electrode formed on said high temperature oxide layer.

19. The capacitor of claim 18 further comprising nitride spacers formed on sidewalls of said high temperature oxide and said second electrode.

20. The capacitor of claim 19 further comprising silicide regions formed in said first electrode and said second electrode.

* * * * *

UNITED STATES PATENT AND TRADEMARK OFFICE
CERTIFICATE OF CORRECTION

PATENT NO.    : 6,218,315
DATED         : April 17, 2000
INVENTOR(S)   : Arne W. Ballantine et al.

It is certified that error appears in the above-identified patent and that said Letters Patent is hereby corrected as shown below:

Title page,
Item [75], Inventors: "Gold Spring" should read -- Cold Spring --

Column 5,
Line 4, "as in" should read -- gas in --

Signed and Sealed this

First Day of January, 2002

Attest:

JAMES E. ROGAN
Attesting Officer    Director of the United States Patent and Trademark Office